US008780550B2

(12) United States Patent
Curtis et al.

(10) Patent No.: US 8,780,550 B2
(45) Date of Patent: Jul. 15, 2014

(54) DAMPENING ACOUSTIC VIBRATIONS WITHIN AN ELECTRONIC SYSTEM

(75) Inventors: Robert Boyd Curtis, Allen, TX (US); Robert W. Skoog, Plano, TX (US); Christian L. Belady, McKinney, TX (US); Jeffrey N. Metcalf, Frisco, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 2107 days.

(21) Appl. No.: 11/526,993

(22) Filed: Sep. 26, 2006

(65) Prior Publication Data

US 2008/0074841 A1   Mar. 27, 2008

(51) Int. Cl.
*H05K 5/00* (2006.01)

(52) U.S. Cl.
USPC ...... 361/679.49; 361/695; 361/807; 361/812; 181/225; 415/119

(58) Field of Classification Search
USPC ............... 361/687, 676–678, 679.46–679.54, 361/688–722, 807, 812, 816, 831; 415/115, 415/119, 173.1, 208.2; 181/198–199, 213, 181/224–225, 200, 205, 286, 292
See application file for complete search history.

(56) References Cited

U.S. PATENT DOCUMENTS

| | | | | |
|---|---|---|---|---|
| 3,890,060 A * | 6/1975 | Lipstein | ......................... | 415/119 |
| 4,279,325 A * | 7/1981 | Challis | ......................... | 181/211 |
| 4,354,801 A | 10/1982 | LaBaire | | |
| 4,508,486 A | 4/1985 | Tinker | | |
| 4,692,091 A | 9/1987 | Ritenour | | |
| 4,750,860 A * | 6/1988 | Kelley | ......................... | 415/119 |
| 4,807,718 A * | 2/1989 | Lotz | ......................... | 181/202 |
| 5,979,541 A * | 11/1999 | Saito | ......................... | 165/80.3 |
| 6,104,608 A * | 8/2000 | Casinelli et al. | ............. | 361/692 |
| 6,288,897 B1 * | 9/2001 | Fritschle et al. | ............. | 361/687 |
| 6,379,110 B1 * | 4/2002 | McCormick et al. | ......... | 415/119 |
| 6,481,527 B1 | 11/2002 | French et al. | | |
| 6,524,064 B2 * | 2/2003 | Chou et al. | ..................... | 415/119 |
| 6,745,149 B2 * | 6/2004 | Beeten | ......................... | 702/132 |
| 6,896,095 B2 * | 5/2005 | Shah et al. | ..................... | 181/198 |
| 6,914,779 B2 * | 7/2005 | Askeland et al. | ............. | 361/687 |
| 7,314,113 B2 * | 1/2008 | Doll | ............................. | 181/225 |
| 2002/0015640 A1 * | 2/2002 | Nishiyama et al. | ........... | 415/119 |
| 2003/0183446 A1 | 10/2003 | Shah et al. | | |
| 2006/0131101 A1 | 6/2006 | Crocker | | |
| 2006/0185931 A1 * | 8/2006 | Kawar | ......................... | 181/202 |
| 2008/0065245 A1 * | 3/2008 | Tang et al. | ..................... | 700/94 |

* cited by examiner

*Primary Examiner* — Courtney Smith

(57) ABSTRACT

An electronic system includes a component that heats up during operation and an acoustic dampening air moving assembly. The acoustic dampening air moving assembly includes air moving blades, a motor, a support structure and a housing. The motor is attached to the air moving blades to rotate the air moving blades. The support structure supports the motor and the air moving blades within the housing. The housing and the support structure at least partially include a material selected for its acoustic dampening characteristics. The acoustic dampening air moving assembly moves air to the component to cool the component. The selected material dampens acoustic vibrations within the electronic system.

16 Claims, 4 Drawing Sheets

DAMPENING ACOUSTIC VIBRATIONS WITHIN AN ELECTRONIC SYSTEM

BACKGROUND

Various types of electronic systems, such as computerized devices, emit noise. A common cause of such noise emission includes the workings of any moving parts within the electronic system. For example, the generation of air movement for cooling purposes involves the operation of air movers, such as fans and blowers. The air mover typically has a relatively fast rotating motor and blades. The motion of the motor and blades sets up acoustic vibrations in the air, as well as in the structures, within the electronic system.

Such noise can be, at best, simply annoying or, at worst, actually harmful to persons or devices that are within the vicinity of the electronic systems. Structural vibrations, for instance, may cause components to become disconnected or weakened within the electronic system or in nearby structures. Additionally, airborne acoustic vibrations may create a loud, noisy work environment, which can unduly stress nearby workers. The potentially deleterious effects of the noise may be particularly severe if several of the electronic systems are housed within the same confined space, thereby combining the acoustic vibrations of several noise sources.

DETAILED DESCRIPTION

Figure 1:
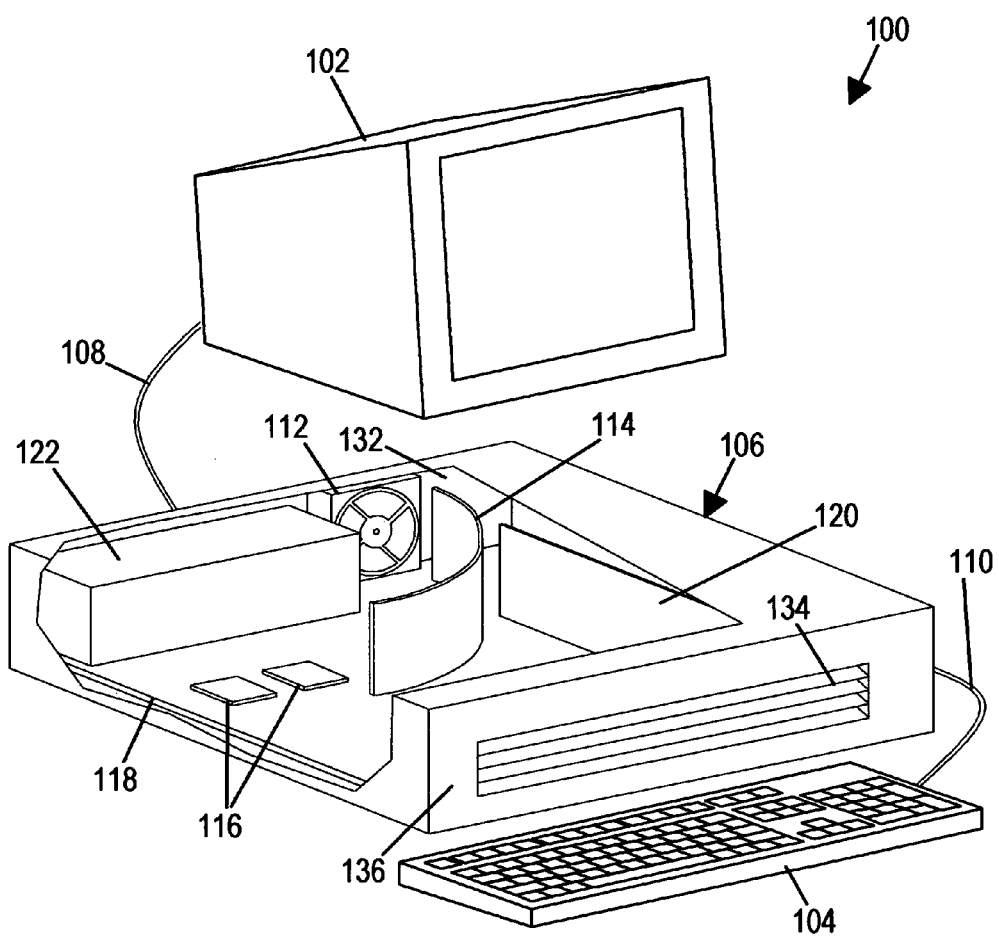
FIG. 1 is a perspective view of an exemplary electronic system incorporating an embodiment of the present invention.

An exemplary electronic system 100 incorporating an embodiment of the present invention is shown in FIG. 1 with an exemplary acoustic dampening air moving assembly as described below. For purposes of this description, the electronic system 100 is shown as a computer system. The electronic system 100, however, may be any appropriate electronic device (e.g. a computer server, a rack-based computerized device, a DVD player/recorder, a television, etc.) having some or all of the features and functions described herein. For this example, the electronic system 100 generally includes an optional display 102, an optional keyboard 104 and a computer housing 106 connected together by cables 108 and 110. The interior of the housing 106 generally contains various combinations of electrical and mechanical components, such as one or more air movers (e.g. an axial fan) 112, one or more air movement guides 114 and one or more heat generating components 116. Additionally, the interior of the housing 106 may contain a variety of other electrical and mechanical components, such as a system printed circuit board (PCB) 118, internal wall-like components (e.g. cages, add-in cards and/or additional PCBs) 120 and relatively large block components (e.g. power supplies, hard drives, removable media drives, etc.) 122.

Figure 2:
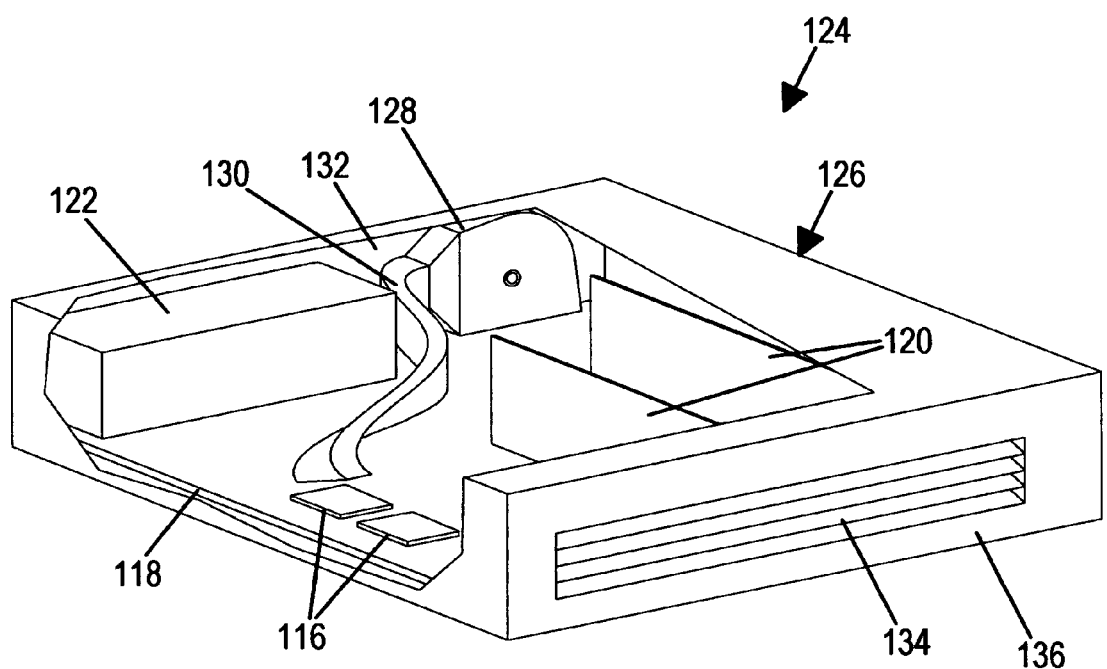
FIG. 2 is a perspective view of a portion of an alternative electronic system incorporating an embodiment of the present invention.

Another exemplary electronic system 124 incorporating another embodiment of the present invention is shown in FIG. 2 with an alternative exemplary acoustic dampening air moving assembly as described below. For purposes of this description, the electronic system 124 is also depicted as a computer system, but only a housing 126 is shown. As with the electronic system 100, the electronic system 124 may be any appropriate electronic device (e.g. a computer server, a rack-based computerized device, a DVD player/recorder, a television, etc.) having some or all of the features and functions described herein. For this example, the interior of the housing 126 generally contains various combinations of electrical and mechanical components, such as one or more air movers (e.g. a centrifugal blower) 128, one or more air movement guides 130 and one or more of the heat generating components 116. Additionally, the interior of the housing 126 may contain a variety of other electrical and mechanical components, such as the system PCB 118, the internal wall-like components 120 and the relatively large block components 122.

In these examples, the internal wall-like components 120 and the relatively large block components 122 are exemplary only. There may be any number (including zero) of these components 120 and/or 122 having any size and/or shape placed in any location within the housing 106 or 126. These components 120 and 122 are included herein merely to illustrate examples of obstructions within the housing 106 or 126.

In these examples, the heat generating components 116 are placed at any appropriate location within the housing 106 or 126, where the heat generating components 116 can operate according to a desired function for the electronic system 100 or 124. For example, the heat generating components 116 may be placed on the system PCB 118 (as shown), in the block component 122 or on the wall-like component 120. In this manner, the heat generating components 116 may interconnect and interoperate with other electronic or mechanical components of the electronic system 100 or 124.

In these examples, the air mover 112 or 128 is placed at any appropriate location within the housing 106 or 126, such as at an opening in a back wall 132 of the housing 106 or 126. In this position, operation of the air mover 112 or 128 causes air to flow into the housing 106 or 126 (e.g. through the opening in the back wall 132) and out an appropriate other opening (e.g. through vents 134 in a front wall 136) of the housing 106 or 126.

In these examples, heat generated by the components 116 is dissipated in order to maintain proper or optimum operation of the heat generating components 116 and of the electronic system 100 or 124. Therefore, the airflow from the air mover 112 or 128 is preferably directed to the heat generating components 116 for cooling purposes. If the air mover 112 or 128 cannot force the airflow directly onto the heat generating components 116, then one or more of the air movement guides 114 or 130 is used to deflect or guide the airflow to the heat generating components 116. In other words, if the block components 122 and/or the wall-like components 120 restrict the placement of the air mover 112 or 128 or undesirably affect the direction of the airflow, then one or more of the air movement guides 114 and/or 130 is placed in the housing 106 or 126 to remedy the condition.

The air movement guide 114 (FIG. 1) is illustrated as a curved wall placed near the air mover 112 that deflects airflow from the air mover 112 around the block component 122, away from the wall-like component 120 and generally toward the heat generating components 116. The air movement guide 130 (FIG. 2), on the other hand, is illustrated as a duct connected to an outlet of the air mover 128 through which the airflow passes directly from the air mover 128 to an outlet positioned adjacent the heat generating components 116. In other embodiments of the present invention, the air movement guide may be any appropriate duct, wall, baffle, or other device that affects the direction of airflow. Additional embodiments may include any appropriate combination and number of air movement guides.

Figure 3:
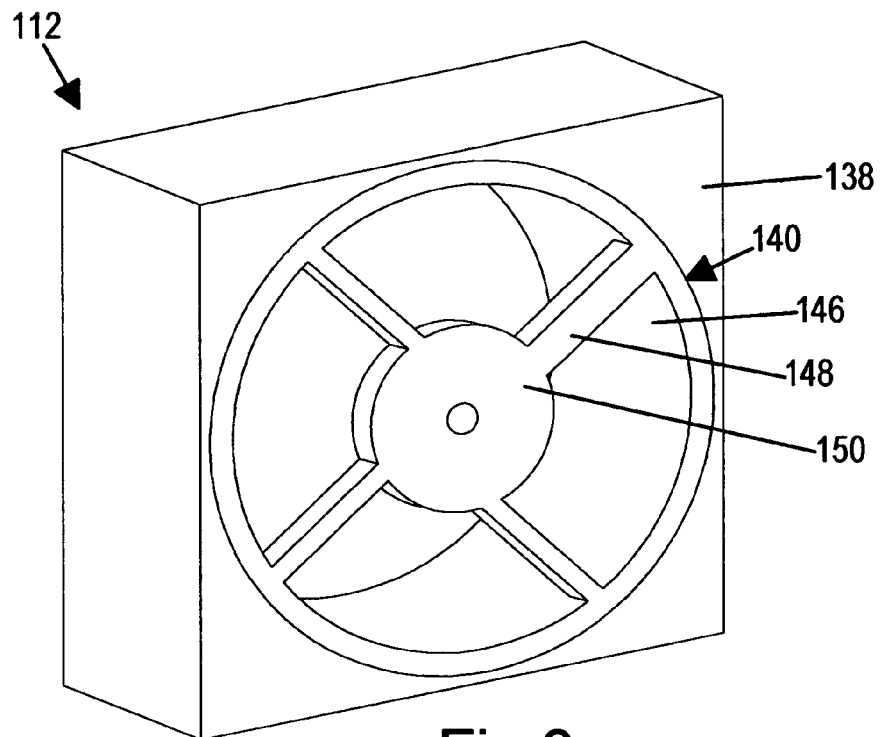
FIG. 3 is a perspective view of a portion of an exemplary air mover for use in the exemplary electronic system shown in FIG. 1 according to an embodiment of the present invention.
Figure 4:
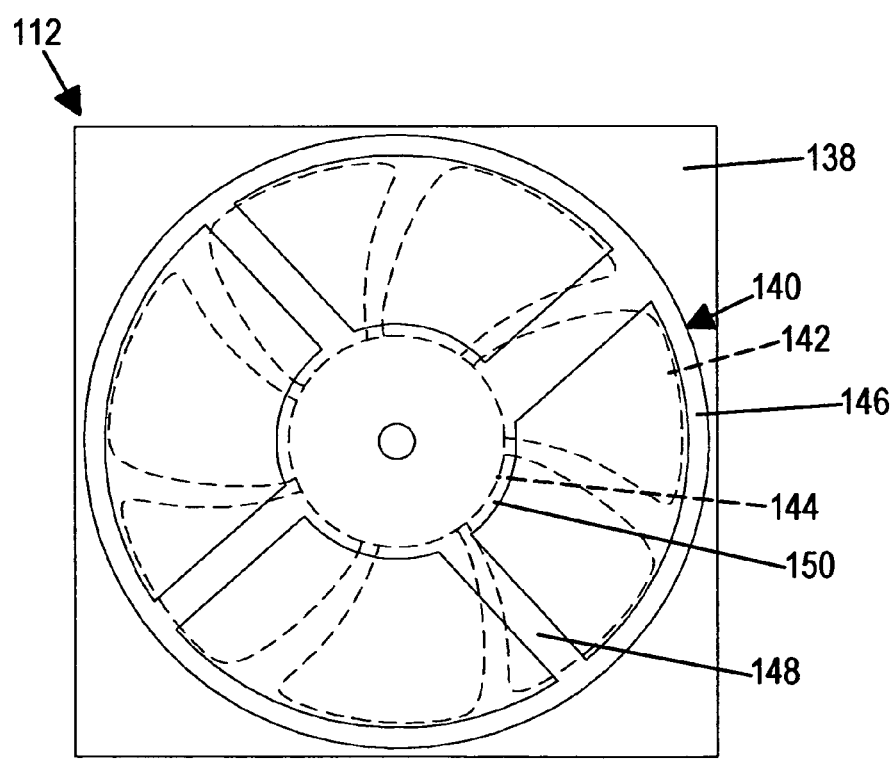
FIG. 4 is a front view of the exemplary air mover shown in FIG. 3 according to an embodiment of the present invention.

In the example illustrated in FIG. 1, the air mover 112 and the air movement guide 114 comprise an "acoustic dampening air moving assembly" as described herein. Likewise, in FIG. 2, the air mover 128 and the air movement guide 130 comprise an "acoustic dampening air moving assembly." In a situation in which no air movement guide (e.g. 114 or 130) is needed, then the air mover 112 or 128 alone may comprise the acoustic dampening air moving assembly. The air mover 112, as shown in the embodiment of FIGS. 1, 3 and 4, is depicted as an axial fan. The air mover 128, as shown in the embodiment of FIGS. 2 and 5-7, is depicted as a centrifugal blower. Other embodiments may incorporate other types of air movers. As a result, various embodiments of the acoustic dampening air moving assembly may include any appropriate combination of one or more air mover and one or more (or none) air movement guide.

To dampen acoustic vibrations, materials for the air movement guide 114 or 130 and at least portions of the air mover 112 or 128 are selected for their acoustic dampening characteristics. Such materials are known as acoustic foams, sound deadening foams, noise canceling substances, noise or sound absorbing materials and acoustic/sound barriers, among other names. Additionally, the material may be reinforced, rigid, semi-rigid or flexible as needed or available for different applications. The acoustic dampening characteristics may be the primary criteria for selecting the material. Other selection criteria may include cost of the material, ease of working with the material and/or structural strength of the material (e.g. when the material must also provide structural support), among other criteria.

The exemplary air mover 112, as shown in FIGS. 3 and 4, generally includes an air mover housing 138, a support structure 140, air moving blades 142 and a motor 144. (The air moving blades 142 and the motor 144 are not shown in FIG. 3 for clarity of showing the housing 138 and support structure 140.) The support structure 140 generally has an outer cylinder portion 146 with struts 148 at one end to hold a motor mount portion 150. The housing 138 generally surrounds the support structure 140 at the outer cylinder portion 146 and provides a means to attach the air mover 112 into the housing 106 of the electronic system 100. The air moving blades 142 and motor 144 form an assembly that is mounted axially to the motor mount portion 150, so the motor 144 can spin the air moving blades 142 within the outer cylinder portion 146 of the support structure 140.

The air mover housing 138 and the support structure 140 are made of the materials selected for their acoustic dampening characteristics with a sufficient thickness to provide a desired amount of acoustic dampening and structural strength. In some embodiments, the air mover housing 138 and the support structure 140 are made of the same material. Some forms of this material, however, can be relatively flexible. Therefore, in other embodiments, the support structure 140 is made of material that is partially selected for its acoustic dampening characteristics and partially selected for its structural strength or may be structurally reinforced. In other words, in such embodiments, the support structure 140 has greater rigidity (if necessary) than the housing 138. In this manner, the support structure 140 provides a firm support for the air moving blades 142 and the motor 144 and will not unduly flex in response to air pressure differentials generated by the spinning air moving blades 142. (Alternatively, only the struts 148 and the motor mount portion 150 of the support structure 140 are structurally reinforced or are made of the acoustic dampening material that is partially selected for it structural strength, and the outer cylinder portion 146 is not reinforced or is made of material selected more for its acoustic dampening characteristics.) Additionally, separate components of the housing 138 and the support structure 140 may be attached together using adhesive methods, a heating method, a molding technique or other appropriate techniques.

Figure 5:
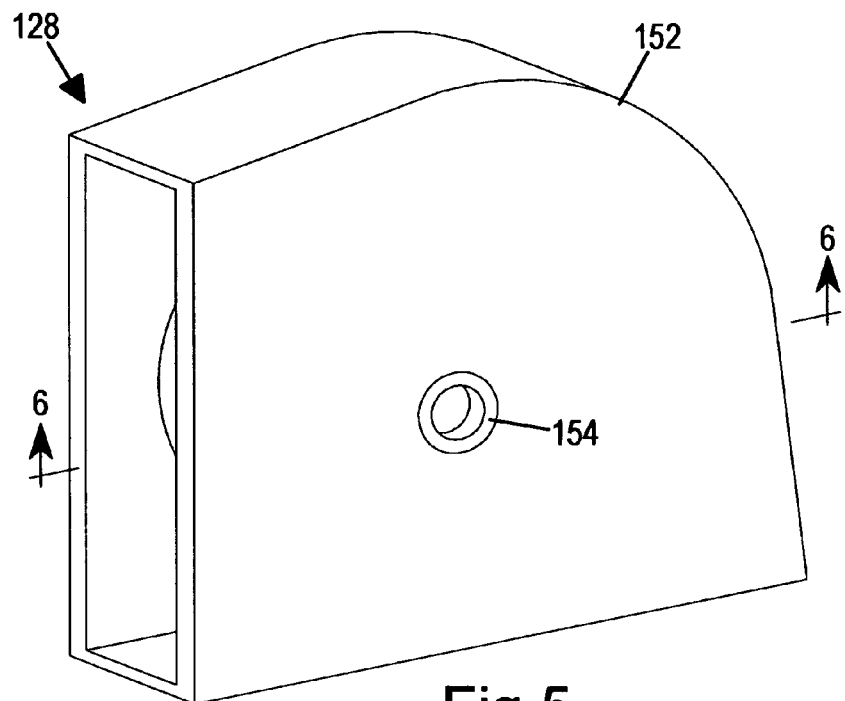
FIG. 5 is a perspective view of a portion of an alternative exemplary air mover for use in the exemplary electronic system shown in FIG. 2 according to an embodiment of the present invention.
Figure 6:
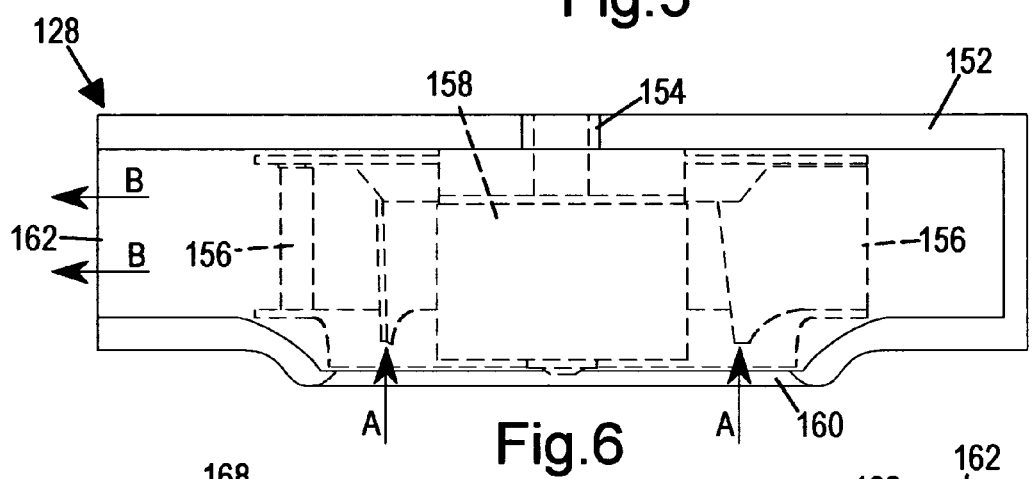
FIG. 6 is a cross section view taken along section lines 6-6 of the exemplary air mover shown in FIG. 5 according to an embodiment of the present invention.

The exemplary air mover 128, as shown in FIGS. 5 and 6, generally includes an air mover housing 152, an axial mount 154, air moving blades 156 and a motor 158. (The air moving blades 156 and the motor 158 are not shown in FIG. 5 for clarity of showing the housing 152 and the axial mount 154.) The air moving blades 156 and the motor 158 are axially mounted within the housing 152 at the axial mount 154, so the motor 158 can spin the air moving blades 156 within the housing 152. The housing 152 generally surrounds the air moving blades 156 and the motor 158 and provides a means to attach the air mover 128 into the housing 126 of the electronic system 124 (FIG. 2). The spinning air moving blades 156 draw air (direction of arrows A) into the housing 152 at an inlet opening 160 in a side of the housing 152 and force the air out (direction of arrows B) of the housing 152 at an outlet opening 162.

Figure 7:
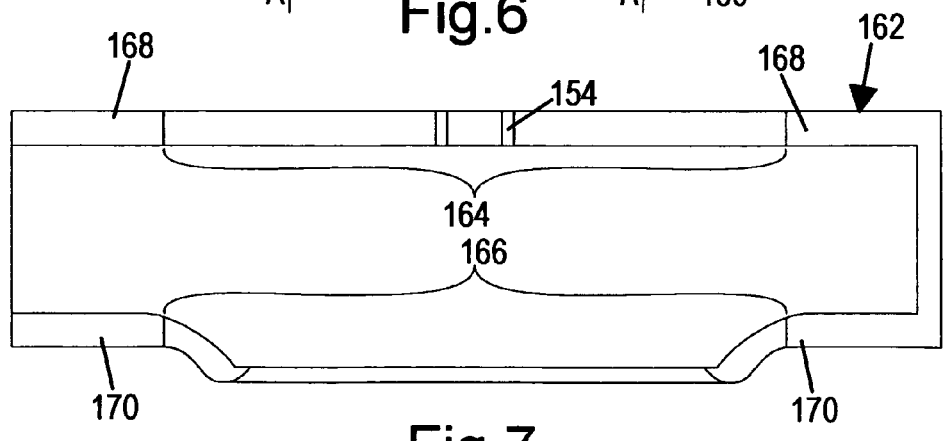
FIG. 7 is a cross section view of an alternative form of the exemplary air mover shown in FIG. 5 according to an embodiment of the present invention.

The air mover housing 152 is made of the materials selected for their acoustic dampening characteristics with a sufficient thickness to provide a desired amount of acoustic dampening and structural strength. In some alternative embodiments, however, as shown in FIG. 7, portions of an alternative housing 162 (e.g. central portions 164 and 166 of sidewalls 168 and 170 of the housing 162) are made of material that is partially selected for its acoustic dampening characteristics and partially selected for its structural strength or may be structurally reinforced. Thus, the central portions 164 and 166 have greater rigidity (if necessary) than the remainder of the housing 152. In this manner, the central portion 164 provides a firm support for the axial mount 154, the air moving blades 156 and the motor 158. Also, the central portions 164 and 166 will not unduly flex in response to air pressure differentials generated by the spinning air moving blades 156. Additionally, separate components of the housing 152 or 162, the axial mount 154 and the central portions 164 and 166 may be attached together using adhesive methods, a heating method, a molding technique or other appropriate techniques.

Structural acoustic vibrations (i.e. vibrations transferred between solid objects) caused by the air mover 112 are generally dampened by the housing 138 and the support structure 140. Similarly, structural acoustic vibrations caused by the air mover 128 are generally dampened by the housing 152 or 162, with or without the more rigid central portions 164 and 166. Airborne acoustic vibrations within the housing 106 or 126 of the electronic system 100 or 124 are absorbed by the acoustic dampening material of the air movement guides 114 or 130, as well as by that of the air movers 112 or 128.

Additionally, the acoustic dampening material described herein is typically of a lighter weight than the plastics and metals used in other air movers and air movement guides. Therefore, in addition to being able to dampen acoustic emissions, some embodiments of the acoustic dampening air moving assemblies described above are also more lightweight than other air movers and air movement guides.

We claim:

1. An electronic system comprising:
   a component that heats up during operation; and
   an acoustic dampening air moving assembly comprising air moving blades, a motor, a support structure, and a single housing, the support structure directly attached to the housing, the motor attached to the air moving blades to rotate the air moving blades, the support structure supporting the motor and the air moving blades within the housing, the housing at least partially comprising a first material selected for its acoustic dampening characteristics, and the support structure at least partially comprising a second material selected for its acoustic dampening characteristics,
   wherein:
   the acoustic dampening air moving assembly moves air to the component to cool the component,
   the first material and the second material dampen acoustic vibrations within the electronic system, and
   the motor is directly attached to the support structure, the support structure has a circular frame defining a first circular hole within which the air moving blades rotate, and the housing defines a second circular hole within which the circular frame of the support structure is disposed.

2. An electronic system as defined in claim 1, wherein:
   structural acoustic vibrations within the electronic system are at least partially attenuated by one or more of the first material and the second material; and
   airborne acoustic vibrations within the electronic system are at least partially absorbed by the one or more of the first and the second material.

3. An electronic system as defined in claim 1, wherein:
   the second material is partially selected for its acoustic dampening characteristics and partially selected for its structural strength, and
   the first material has greater acoustic dampening characteristics than that of the second material.

4. An electronic system as defined in claim 1, wherein the acoustic dampening air moving assembly further comprises an air movement guide having a shape and being disposed relative to the air moving blades to guide air movement to the component, and the air movement guide comprises a third material selected for its acoustic dampening characteristics.

5. An electronic system as defined in claim 4, wherein:
   the air movement guide further comprises an air duct.

6. An electronic system as defined in claim 4, wherein:
   airborne acoustic vibrations within the electronic system are at least partially absorbed by the third material.

7. An acoustic dampening air moving assembly for use within an electronic system comprising:
   air moving blades;
   a motor attached to the air moving blades to rotate the air moving blades and cause air movement within the electronic system;
   a support structure supporting the motor and the air moving blades;
   a single housing within which the support structure, the motor and the air moving blades are disposed, the support structure being directly attached to the housing; and
   an air movement guide having a shape and being disposed relative to the air moving blades to guide air movement within the electronic system;
   wherein:
   the housing at least partially comprises a first material selected for its acoustic dampening characteristics,
   the support structure at least partially comprises a second material selected for its acoustic dampening characteristics,
   the air movement guide at least partially comprises a third material selected for its acoustic dampening characteristics,
   the first material and the second material dampen acoustic vibrations within the electronic system, and
   airborne acoustic vibrations that impinge on the air movement guide are at least partially absorbed by the third material.

8. An acoustic dampening air moving assembly as defined in claim 7, wherein:
   structural acoustic vibrations within the acoustic dampening air moving assembly are at least partially attenuated by one or more of the first material and the second material; and
   the airborne acoustic vibrations that impinge on the acoustic dampening air moving assembly are at least partially absorbed by the one or more of the first material and the second material.

9. An acoustic dampening air moving assembly as defined in claim 7, wherein:
   the second material is partially selected for its acoustic dampening characteristics and partially selected for its structural strength, and
   the first material has greater acoustic dampening characteristics than that of the second material.

10. An acoustic dampening air moving assembly as defined in claim 7, wherein:
    the air movement guide further comprises an air duct.

11. An acoustic dampening air moving assembly as defined in claim 7, wherein:
    the motor is directly attached to the support structure, the support structure has a circular frame defining a first circular hole within which the air moving blades rotate, and the housing defines a second circular hole within which the circular frame of the support structure is disposed.

12. A method of dampening acoustic vibrations within an electronic system comprising:
    moving air through the electronic system by an air mover having a support structure and a single housing such that the support structure is directly attached to the housing, the housing comprising a first material selected for its acoustic dampening characteristics, the support structure comprising a second material selected for its acoustic dampening characteristics;
    dampening acoustic vibrations within the electronic system by the first material and the second material; and
    guiding air movement to a desired location within the electronic system by an air movement guide comprising a third material selected for its acoustic dampening characteristics.

13. A method as defined in claim 12, wherein the dampening further comprises:
    attenuating structural acoustic vibrations within the electronic system at least partially by one or more of the first material and the second material; and absorbing airborne acoustic vibrations within the electronic system at least partially by the one or more of the first material and the second material.

14. A method as defined in claim 12, wherein:

the second material is partially selected for its acoustic dampening characteristics and partially selected for its structural strength, and the first material of the housing has greater acoustic dampening characteristics than that of the second material.

15. A method as defined in claim 12, wherein:

the guiding further comprises ducting the air movement through the electronic system by an air duct, and the method further comprises absorbing airborne acoustic vibrations within the electronic system at least partially by the third material.

16. A method as defined in claim 12, wherein:

a motor of the air mover is directly attached to the support structure, the support structure has a circular frame defining a first circular hole within which air moving blades of the air mover rotate, and the housing defines a second circular hole within which the circular frame of the support structure is disposed.

\* \* \* \* \*